(12) United States Patent
Nitsche et al.

(10) Patent No.: US 6,570,188 B1
(45) Date of Patent: May 27, 2003

(54) OPTOELECTRONIC COMPONENT FOR DATA TRANSMISSION

(75) Inventors: Volker Nitsche, Tamm (DE); Werner Schairer, Weinsberg (DE)

(73) Assignee: Temic Telefunken Microelectronic GmbH, Heilbronn (DE)

( * ) Notice: Subject to any disclaimer, the term of this patent is extended or adjusted under 35 U.S.C. 154(b) by 742 days.

(21) Appl. No.: 08/995,139

(22) Filed: Dec. 19, 1997

(30) Foreign Application Priority Data

Dec. 19, 1996 (DE) .......................................... 196 53 054

(51) Int. Cl.7 .............................................. H01L 27/15
(52) U.S. Cl. .......................................... 257/81; 257/432
(58) Field of Search .............................. 257/81, 82, 432, 257/692, 693, 696

(56) References Cited

U.S. PATENT DOCUMENTS

| | | | |
|---|---|---|---|
| 5,382,810 A | * 1/1995 | Isaksson | 257/81 |
| 5,432,340 A | 7/1995 | Shibata | |
| 5,506,445 A | * 4/1996 | Rosenberg | 257/666 |
| 5,821,615 A | * 10/1998 | Lee | 257/686 |

FOREIGN PATENT DOCUMENTS

| | | |
|---|---|---|
| DE | 19536216 | 7/1996 |
| EP | 0230336 A1 | 7/1987 |
| EP | 0400176 | 12/1990 |
| EP | 0400176 A1 | 12/1990 |
| EP | 0524406 | 1/1993 |
| JP | 7-50379 | 2/1995 |

* cited by examiner

*Primary Examiner*—Douglas A. Wille
(74) *Attorney, Agent, or Firm*—Venable, LLP; Norman N. Kunitz

(57) ABSTRACT

An optoelectronic component for data transmission with infrared radiation is described. This component integrates in a single housing an infrared transmitter, an infrared receiver and an integrated circuit for signal conditioning. owing to a particular design of the connecting legs, all of which emerge from the housing at one lateral face and are bent twice through 90° so that they extend in part parallel to this lateral face and in part to the rear side, and owing to additional protrusions on the housing in the form of supporting feet and a bearing shoulder, it is possible to process the IrDA transceiver module both in the top view and in the side view position in surface mounting technology. Assembly is performed with an accuracy that is typical for surface mount devices. No additional mounting aids are needed.

5 Claims, 1 Drawing Sheet

OPTOELECTRONIC COMPONENT FOR DATA TRANSMISSION

BACKGROUND OF THE INVENTION

The invention relates to an optoelectronic component for data transmission with a radiation-emitting semiconductor chip arranged on a first part of a conductor strip and a semiconductor chip that responds to radiation arranged on a second part of the conductor strip and with a housing that in certain sections at least is transparent for the radiation used for data transmission and which encloses the conductor strip with the exception of the external connecting legs of the conductor frame, all of which protrude from a single lateral face of the housing.

The IrDA standard has been developed for data transmission by means of an optical point-to-point transmission path. Integrated transceiver modules complying with the IrDA standard are obtainable from the company TEMIC TELE-FUNKEN microelectronic with the designation TFDS 3000. An infrared transmitter, an infrared receiver and an integrated circuit for signal conditioning are arranged in a single housing. one surface side of the module has two lens-shaped protrusions containing in the approximate focal point the transmitter and the receiver respectively. These optical systems are necessary in order to achieve the directional signal emission of the transmitter and the directional sensitivity of the receiver as called for in the IrDA standard. All connecting legs on the component emerge from the molded body of the housing on one side of the housing and are bent at a distance away from the housing. At both ends of the housing there is in addition a reinforced connecting leg that acts as guide pin for anchoring the component in the printed-circuit board or in the carrier used for the assembly and which is not bent in either case. These guide pins are required in order to join the component accurately to the printed-circuit board and in order to obtain the required directional accuracy of the emission and receiving angles. Due to the arrangement of the connecting legs, this known component is suitable for surface mounting only under specific conditions. The transmission and receiving direction is parallel to the mounting plane.

Components from other manufacturers are also known where the connecting legs are formed in such a way that the components can be installed horizontally. The transmission and receiving direction is then perpendicular to the mounting plane.

The disadvantage with these known components is that, depending on the required type of mounting (transmission and receiving direction parallel to the mounting plane or transmission and receiving direction perpendicular to the mounting plane) a differently designed component is needed with the same optical and electrical properties. In manufacturing the component, two sets of tools are therefore needed to produce the legs and when mounting the component in circuit arrangements the requisite components must be kept on stock for each type of mounting. Another problem is that of mounting the component in the correct direction on the printed-circuit board. With the known components, either an additional orientation is avoided completely or provision is made for the guide pins in the printed-circuit board as described above. However, these are not fully compatible with surface mounting technology.

SUMMARY OF THE INVENTION

The object of the invention is to provide an optoelectronic component for data transmission that ensures simple mounting with high directional accuracy and which is suitable for lateral emission (parallel to the mounting surface) and for upwards emission (perpendicular to the mounting surface) in surface mounting technology.

This object is solved by an optoelectronic component for data transmission with the characteristic features given in claim 1.

The advantageous development of the invention is given by the characteristic features of the Subclaims.

DETAILED DESCRIPTION OF THE INVENTION

The invention will now be described on the basis of an embodiment example making reference to the drawings.

Figure 1:
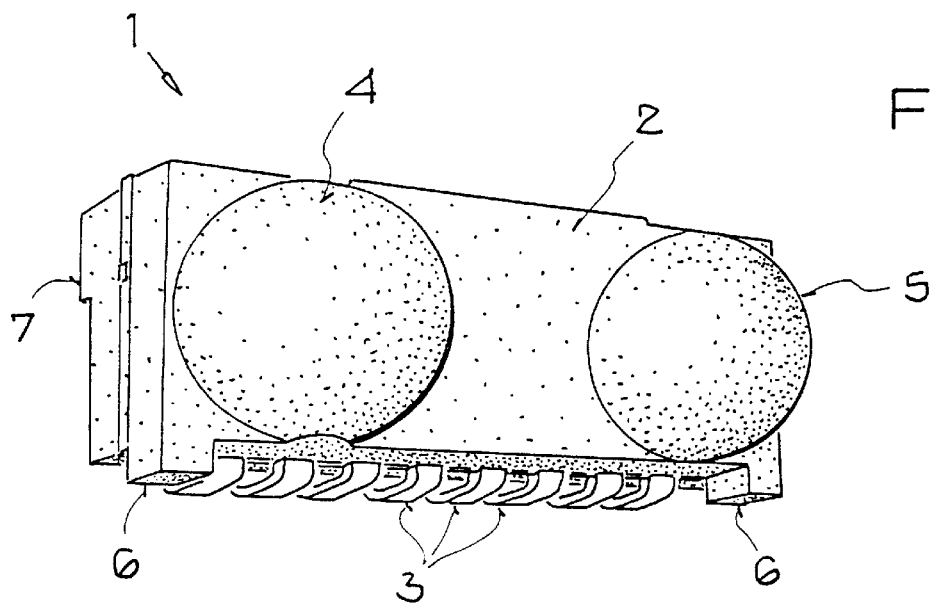
FIG. 1 is a perapective view illustrating an optoelectronic component in accordance with the invention.
Figure 2:
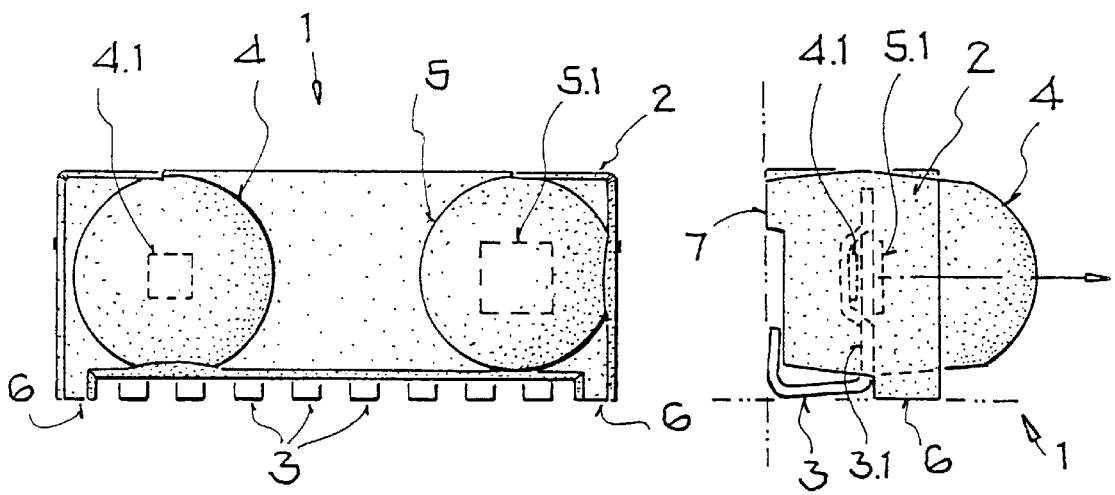
FIGS. 2–4 show the optoelectronic component of FIG. 1 in various views.
Figure 3:
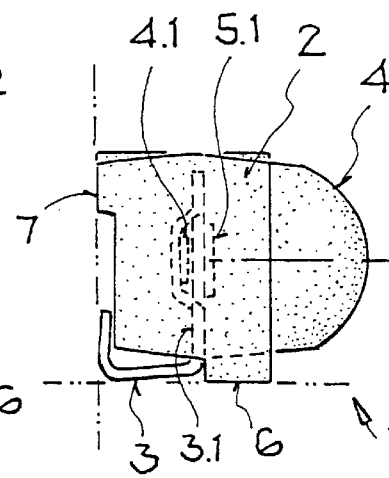
Figure 4:
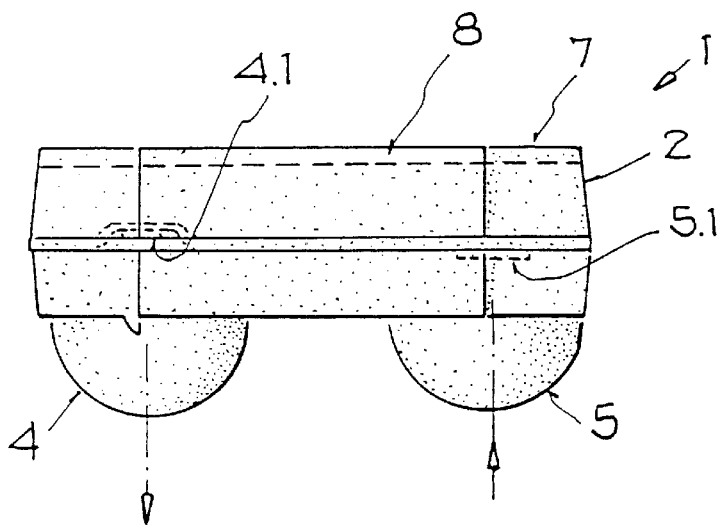

The IrDA transceiver 1 illustrated in FIGS. 1 to 4 integrates in a single housing 2 an infrared transmitter 4.1, and infrared receiver 5.1 and an integrated circuit for signal conditioning that is not shown in the Figures. The external connecting legs 3 of the conductor frame 3.1 all emerge from one lateral face of the housing 2 towards the outside. They are bent immediately behind the housing through an angle of approximately 90°. towards the rear side of the housing and are then taken along a line nearly parallel to the lateral face up to the rear edge of the housing 2. At the rear edge of the housing 2, the external connecting legs 3 are bent for a second time through approximately 90° around this edge. They then extend up to their end along the rear side of the housing 2 in a line nearly parallel to the rear side. By forming the connecting legs 3 in this way, it is possible to mount the IrDA transceiver 1 by two different means in surface mounting technology (SMT) on a printed-circuit board or on any other suitable carrier.

In the first type of mounting, the emission direction of the infrared transmitter 4.1 and the receiving direction of the infrared receiver 5.1 are oriented perpendicularly to the mounting plane given by the printed-circuit board. In this case, one speaks of a top view arrangement. in the second type of mounting, the emission direction of the infrared transmitter 4.1 and the receiving direction of the infrared receiver 5.1 are oriented parallel to the mounting plane given by the printed-circuit board. In this case, one speaks of a side view arrangement.

The emission and receiving direction of the transceiver 1 is given by the protruding shape of the optical elements 4, 5 on the upper side of the housing 2. The narrow optical angle of aperture specified in the IrDA standard for the oriented data transmission calls for high precision when mounting the component 1 on a printed-circuit board. Special protruding shapes are therefore provided on the housing 2 on the two surface sides suitable for mounting permitting accurate alignment of the transceiver 1 on the carrier provided for mounting. Accordingly, an additional supporting foot 6 is formed at each of the front corners of the housing 2 on the mounting side for the side view arrangement, i.e. on the lateral face at which the external connecting legs 3 protrude from the housing 2. The supporting feet 6 are of such a length that the transmission and receiving axis of the transceiver component is parallel to the assembly plane in the side view mounting arrangement. When mounting in this way on the carrier, the transceiver is located and aligned on the carrier by the external connecting legs 3 and the supporting feet 6.

Provision is made at the rear of the housing 2 for a bearing shoulder 7 that extends along the entire side and which in other embodiments of the invention is divided up into several bearing points. The bearing shoulder is preferably arranged directly at the edge of the lateral face of the housing 2 which faces away from the connecting legs 3. The height of the bearing shoulder 7 is selected in such a way that, in the case of the mounting direction for alignment of the optical axis perpendicular to the top view mounting plane, the transceiver module is placed on the one hand on the bearing shoulder 7 and on the other hand on the section of the connecting legs 3 that is parallel to the rear side. The emission and receiving direction of the transceiver 1 is then at right angles to the mounting plane.

One lateral face of the housing has a special partial surface 8 which is suitable for stamping with a type designation and as a landing surface for a suction pipe in SMT assembly.

Owing to the particular design of the connecting legs 3, all of which emerge from one lateral face of the housing 2 and are bent twice through 90° so that they are in part parallel to this lateral face and in part parallel to the rear side, and owing to the additional protrusions on the housing 2 in the form of the supporting feet 6 and the bearing shoulder 7, it is possible to process the IrDA transceiver 1 both in the top view and in the side view position in surface mounting technology. Assembly is accomplished with an accuracy that facilitates matching the IrDA specification. Additional assembly aids are not needed.

What is claimed is:

1. An optoelectronic component for data transmission (1) with a radiation-emitting semiconductor chip (4.1) arranged on a first part of a conductor strip (3.1) and a semiconductor chip (5.1) that responds to radiation arranged on a second part of the conductor strip (3.1) and with a housing (2) that in certain sections at least is transparent for the radiation used for data transmission and which encloses the conductor strip (3.1) with the exception of the external connecting legs (3) of the conductor frame, all of which protrude from a. single lateral face of the housing wherein all external connecting legs (3) are bent for the first time immediately behind the housing (2) such that they extend along the lateral face; and wherein all external connecting legs (3) are bent a second time at the edge to the rear side of the housing (2) such that they extend along the rear side; and wherein supporting surfaces (6, 7) on which the housing rests are arranged on the lateral face at which the connecting legs emerge from the housing and on the rear side of the housing as required for the respective direction of mounting.

2. An optoelectronic component in accordance with claim 1, wherein a supporting foot (6) is formed onto each of the front corners of the housing as bearing. surface on the lateral face.

3. An optoelectronic component in accordance with claim 1 wherein a supporting surface is formed on the rear of the housing to act as a bearing shoulder (7) on the housing.

4. An optoelectronic component in accordance with claim 3, wherein the bearing shoulder (7) extends at right angles to the connecting legs (3).

5. An optoelectronic component in accordance with claim 1 wherein the housing (2) has an upper side that has a protrusion (4) above the radiation-emitting semiconductor chip (4.1) and another protrusion (5) above the semiconductor chip (5.1) that responds to radiation, and where each of these protrusions acts as an optically refractive element.

* * * * *